(12) United States Patent
Narumi

(10) Patent No.: US 9,853,380 B2
(45) Date of Patent: Dec. 26, 2017

(54) ELECTRONIC COMPONENT SOCKET

(71) Applicant: ENPLAS CORPORATION, Kawaguchi-shi (JP)

(72) Inventor: Keiichi Narumi, Kawaguchi (JP)

(73) Assignee: ENPLAS CORPORATION, Kawaguchi-shi (JP)

( * ) Notice: Subject to any disclaimer, the term of this patent is extended or adjusted under 35 U.S.C. 154(b) by 0 days.

(21) Appl. No.: 15/108,282

(22) PCT Filed: Dec. 24, 2014

(86) PCT No.: PCT/JP2014/084117
§ 371 (c)(1),
(2) Date: Jun. 24, 2016

(87) PCT Pub. No.: WO2015/098947
PCT Pub. Date: Jul. 2, 2015

(65) Prior Publication Data
US 2016/0308293 A1 Oct. 20, 2016

(30) Foreign Application Priority Data

Dec. 27, 2013 (JP) ................................. 2013-272297

(51) Int. Cl.
*H01R 12/71* (2011.01)
*H01R 12/70* (2011.01)
(Continued)

(52) U.S. Cl.
CPC ....... *H01R 12/714* (2013.01); *H01R 12/7058* (2013.01); *H05K 7/20418* (2013.01); *G01R 1/0466* (2013.01); *H01R 2201/20* (2013.01)

(58) Field of Classification Search
CPC .............................. H01R 12/88; H01R 13/193
(Continued)

(56) References Cited

U.S. PATENT DOCUMENTS 5,326,271 A * 7/1994 Kishi ................... H05K 7/1023
439/331
5,791,915 A * 8/1998 Kubo ................... H05K 7/1023
439/331
(Continued)

FOREIGN PATENT DOCUMENTS

JP S60-38487 3/1985
JP 04-169086 A 6/1992
(Continued)

OTHER PUBLICATIONS

International Preliminary Report on Patentability dated Jul. 7, 2016, which issued in International Application No. PCT/JP2014/084117, and English language translation thereof.
(Continued)

*Primary Examiner* — Tulsidas C Patel
*Assistant Examiner* — Marcus Harcum
(74) *Attorney, Agent, or Firm* — McDermott Will & Emery LLP

(57) ABSTRACT

An IC socket includes: a socket main body having an accommodating part for accommodating an IC package; a socket cover having a one-side end portion pivotally supported by the socket main body, and the other-side end portion which is located opposite to the one-side end portion and lockable to the socket main body; and a heat dissipating member mounted on the socket cover and caused to press the IC package. The socket cover includes a metal plate extending from the one-side end portion to the other-side end portion so that the thickness direction of the metal plate is parallel to the direction in which the socket cover faces the accommodating part when the other-side end portion is locked to the socket main body. The metal plate has a depression formed by bending the metal plate.

9 Claims, 17 Drawing Sheets

(51) Int. Cl.
  *H05K 7/20* (2006.01)
  *G01R 1/04* (2006.01)
(58) Field of Classification Search
  USPC .................................................. 439/73, 331
  See application file for complete search history.

(56) References Cited

U.S. PATENT DOCUMENTS

| | | | | |
|---|---|---|---|---|
| 6,744,269 | B1* | 6/2004 | Johnson | G01R 31/2849 |
| | | | | 324/750.05 |
| 7,230,830 | B2* | 6/2007 | Ujike | G01R 1/0458 |
| | | | | 257/718 |
| 7,540,745 | B2* | 6/2009 | Lin | G01R 31/2863 |
| | | | | 324/750.05 |
| 7,824,188 | B2* | 11/2010 | Yokoyama | H05K 7/1061 |
| | | | | 439/331 |
| 7,828,576 | B2* | 11/2010 | Lin | G01R 1/0466 |
| | | | | 439/331 |
| 7,833,021 | B2* | 11/2010 | Lin | G01R 1/0466 |
| | | | | 439/331 |
| 8,562,367 | B2* | 10/2013 | Yokoyama | G01R 1/0466 |
| | | | | 439/331 |
| 8,905,765 | B2* | 12/2014 | Yeh | H05K 7/00 |
| | | | | 439/331 |
| 2004/0266245 | A1* | 12/2004 | Liao | H05K 7/1007 |
| | | | | 439/331 |
| 2007/0238327 | A1* | 10/2007 | Hsu | G01R 31/2863 |
| | | | | 439/70 |
| 2008/0076272 | A1* | 3/2008 | Hsu | H05K 7/1061 |
| | | | | 439/55 |
| 2009/0253276 | A1* | 10/2009 | Lin | G01R 1/0458 |
| | | | | 439/68 |
| 2009/0291582 | A1* | 11/2009 | Lin | G01R 1/0466 |
| | | | | 439/331 |
| 2010/0261371 | A1* | 10/2010 | Morinari | G01R 1/0483 |
| | | | | 439/331 |
| 2011/0039425 | A1* | 2/2011 | Hsu | G01R 31/2863 |
| | | | | 439/73 |

FOREIGN PATENT DOCUMENTS

| | | |
|---|---|---|
| JP | 08-264248 A | 10/1996 |
| JP | 2001-174505 A | 6/2001 |
| JP | 2010-135155 A | 6/2010 |
| JP | 2012-069460 A | 4/2012 |
| JP | 2013-020914 A | 1/2013 |
| WO | 2009/051092 A1 | 4/2009 |

OTHER PUBLICATIONS

Japanese Office Action from Japanese Patent Application No. 2013-272297, dated Aug. 15, 2017, 5 pages.

* cited by examiner

ELECTRONIC COMPONENT SOCKET

TECHNICAL FIELD

The present invention relates to an electronic component socket capable of detachably accommodating an electronic component such as an IC package in its socket main body to electrically connect the IC package to a wiring board.

BACKGROUND ART

A conventional IC socket for connecting an electronic component such as an IC package to a wiring board has been configured, for example, as follows. Such a conventional IC socket includes a socket main body provided with an accommodating part for detachably accommodating the electronic component, and a socket cover pivotally supported on the socket main body so as to be movable to open or close the accommodating part. When closed, the socket cover presses to cause the heat dissipating member pivotally supported by the socket cover to press the electronic component accommodated on the accommodating part in the socket main body (see, for example, Patent Document 1).

REFERENCE DOCUMENT LIST

Patent Document

Patent Document 1: JP A 2010-135155

SUMMARY OF THE INVENTION

Problems to be Solved by the Invention

Here, in some of such IC sockets, a distance between the socket cover and the electronic component is reduced due to accumulated molding errors of various components of the IC socket, and this causes the socket cover to press the electronic component too hard. A conceivable measure to suppress that pressing force applied onto the electronic component is to provide a damper such as a spring between the socket cover and the heat dissipating member.

However, providing a damper such as a spring as described above complicates the structure of the IC socket. In particular, when the IC socket needs miniaturizing, it might be difficult to secure a space for placing a spring or the like therein.

To address this problem, the present invention has been made to provide an electronic component socket capable of exerting a damper function with a simple structure.

Means for Solving the Problem

To solve the problem, the electronic component socket according to the present invention includes: a socket main body having an accommodating part for detachably accommodating an electronic component; a socket cover having a one-side end portion pivotally supported by the socket main body to open or close the accommodating part, and an opposite other-side end portion formed lockable to the socket main body, with the socket cover being held in a closed state by locking the other-side end portion to the socket main body; and pressing means provided on the socket cover so as to press the electronic component accommodated on the accommodating part in the closed state. The socket cover includes a metal plate extending from the one-side end portion to the other-side end portion so that the thickness direction of the metal plate is parallel to the direction in which the socket cover faces the accommodating part in the closed state. The metal plate has a depression formed by bending along a line parallel to a rotation shaft of the socket cover in the vicinity of an area that receives a force from the pressing means.

In the electronic component socket described as above, the depression of the metal plate may be formed in a tapered shape so that the opening area thereof can gradually increase from the bottom to the opening.

In addition, the socket cover may have a locking part pivotally supported at the base end to the other-side end portion and formed at the tip end to be lockable to the socket main body for holding the socket cover in the closed state by locking to the socket main body, and the locking part may rotate around a rotation shaft provided in parallel to the rotation shaft of the socket cover.

In addition, in the socket cover, any one of a protrusion and a recess may be formed in an area located between the other-side end portion and the depression and close to the other-side end portion. Meanwhile, in the socket main body, the other one of the protrusion and the recess may be formed in an area facing, in the closed state, the aforementioned area of the socket cover so as to be fitted, in the closed state, to the one of the protrusion and the recess.

Moreover, the protrusion and the recess formed in the socket cover and the socket main body may be formed to extend in parallel to the rotation shaft of the socket cover.

Effects of the Invention

The electronic component socket according to the present invention is capable of exerting a damper function with a simple structure.

MODE FOR CARRYING OUT THE INVENTION

Figure 1:
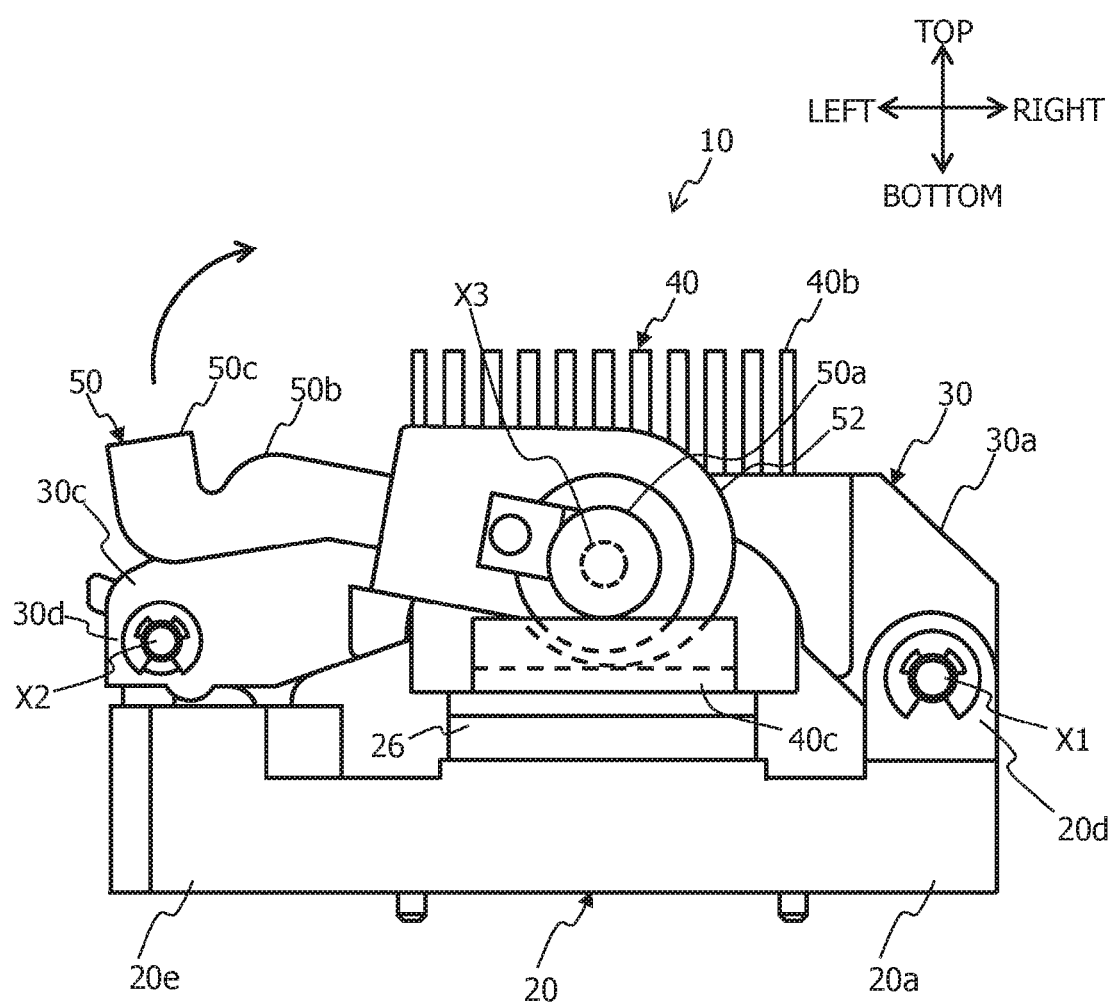
FIG. 1 is a front view of an IC socket according to an embodiment of the present invention, in which the socket cover is closed but the lever member is not locked.

Hereinafter, a detailed description will be given of an embodiment of the present invention with reference to the attached drawings.

FIGS. 1 to 16 show an example of an electronic component socket according to this embodiment.

This electronic component socket is for accommodating and connecting an electronic component with an wiring board for the purpose of, for example, performance testing such as burn-in testing. The electronic component socket is an integrated circuit (IC) socket 10 that is placed on an unillustrated wiring board and accommodates an IC package 100, which serves as an electronic component, to electrically connect the IC package 100 to the wiring board. The IC socket 10 is capable of dissipating heat from the IC package 100 accommodated on the accommodating part of its socket main body by causing a heat dissipating member to abut on the IC package 100 while the socket cover described later is closed (hereinafter referred to as "in the closed state"). The IC socket 10 includes the socket main body 20, the socket cover 30, the heat dissipating member 40 and the lever member 50.

Figure 17A:
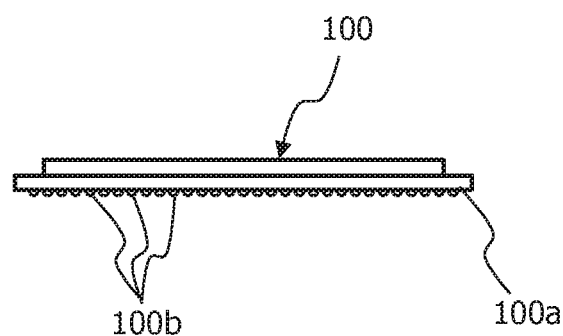
FIGS. 17A and 17B show a front view and a bottom view of an example of the IC package, respectively.
Figure 17B:
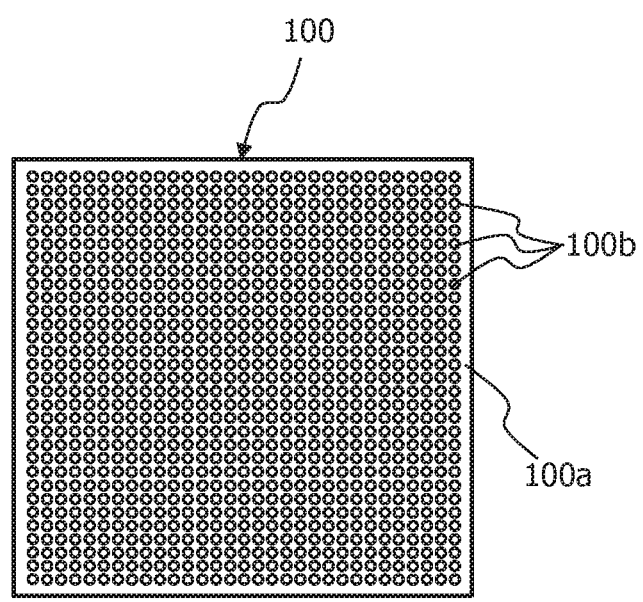

Note that, in the following description, the IC package 100 is assumed to be a ball grid array (BGA) IC package having a bottom surface 100a which is approximately square in the plan view, and semispherical terminals 100b formed in a matrix thereon, as shown in FIG. 17.

Figure 6:
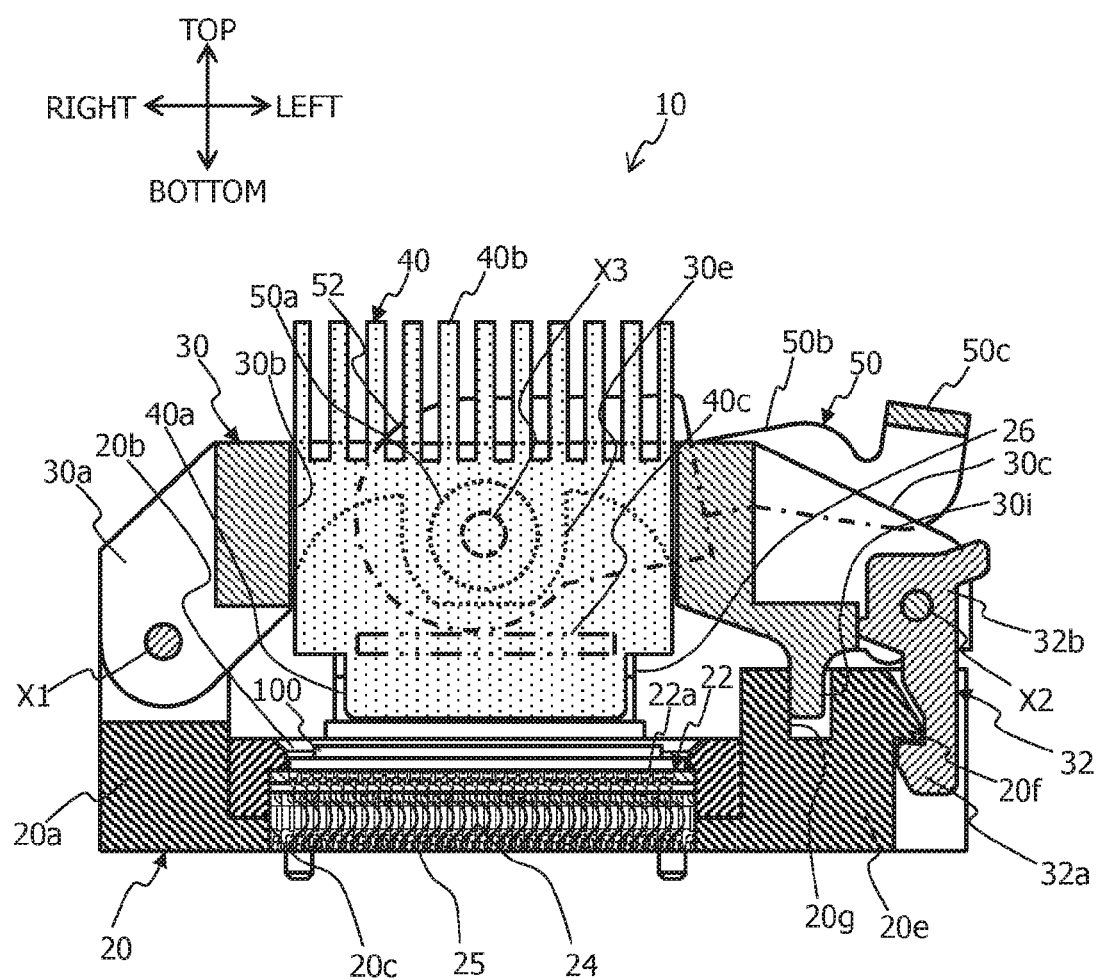
FIG. 6 is a cross-sectional view taken along line A-A of FIG. 3.

The socket main body 20 pivotally supports the socket cover 30 which will be described later rotatably around a first rotation shaft X1 provided on a one-side end portion 20a as shown in FIGS. 1 to 5, and has an accommodating part 20b for accommodating the IC package 100 on the upper surface of the center portion of the socket main body 20 as shown in FIG. 6. In this center portion of the socket main body 20, a recess 20c is formed and a rectangular floating plate 22 is provided therein. The floating plate 22 has an upper surface 22a that serves as the accommodating part 20b and is urged upwardly by an unillustrated spring so as to elastically move up and down.

Figure 8:
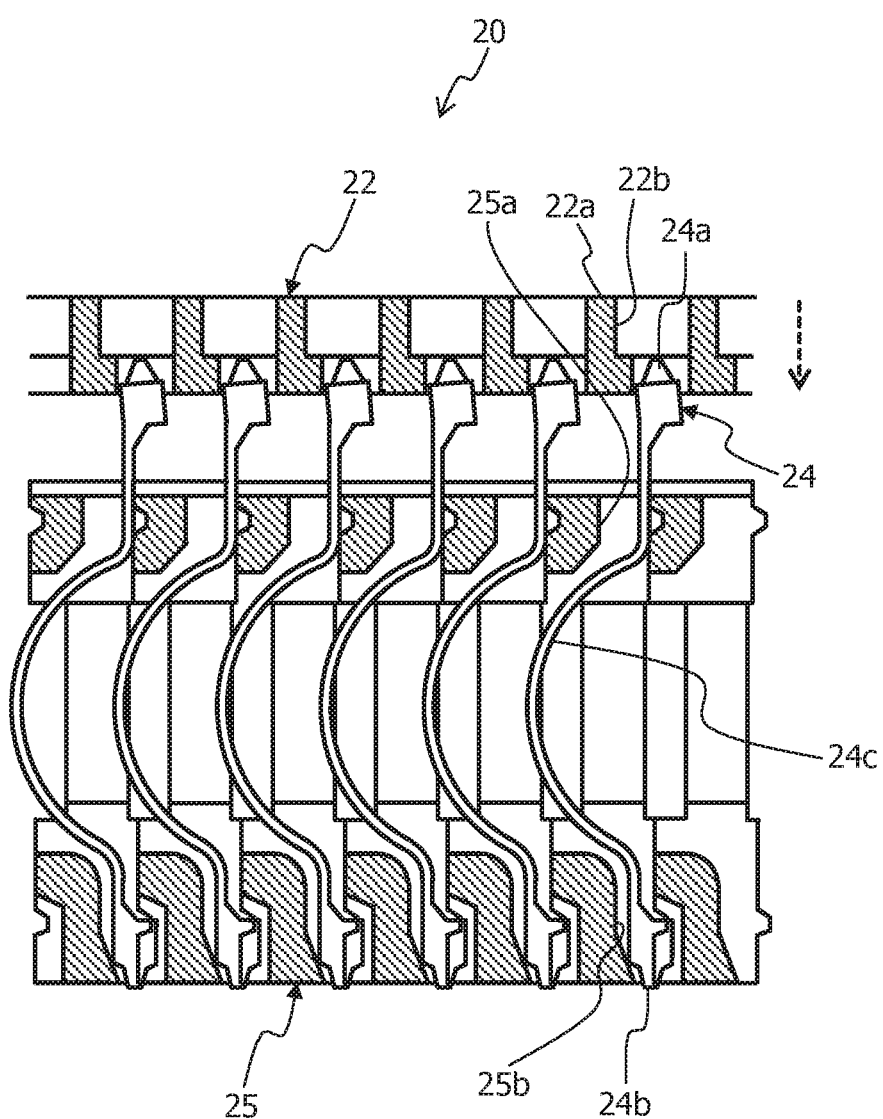
FIG. 8 is a cross-sectional view illustrating an arrangement of contact pins of the IC socket.
Figure 9:
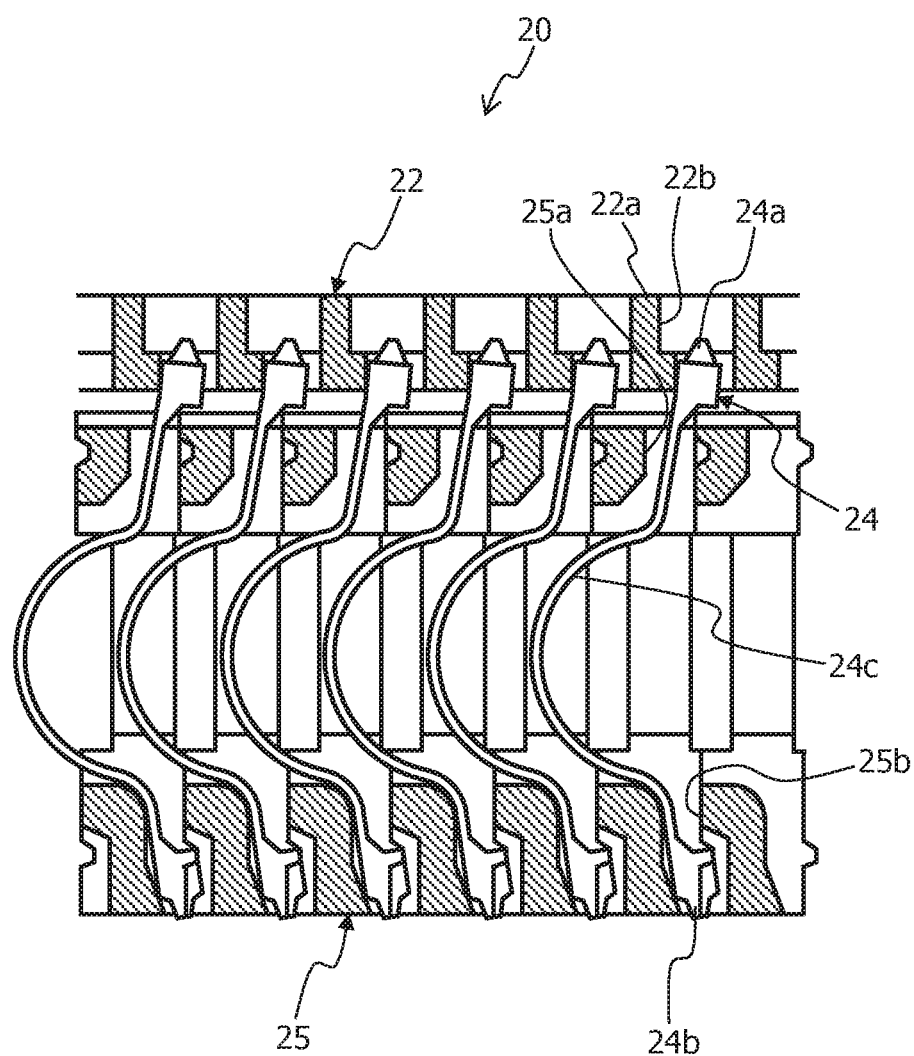
FIG. 9 is a cross-sectional view illustrating the contact pins deformed as a floating plate moves down.
Figure 10:
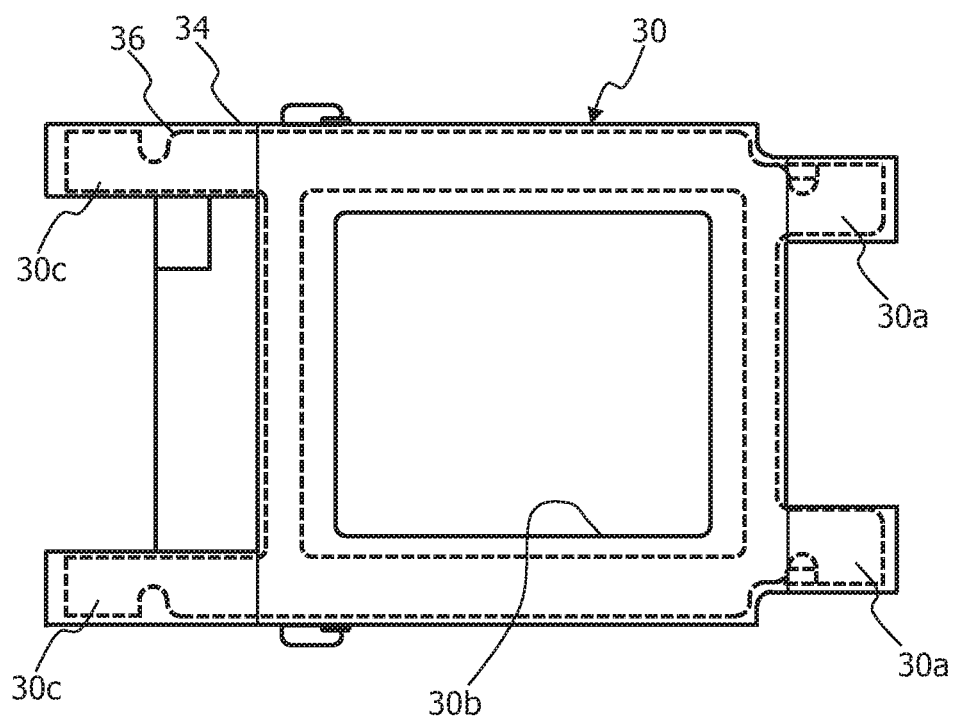
FIG. 10 is a plan view of the socket cover of the IC socket.

Through holes 22b through which contact pins 24 pass are formed in the floating plate 22 as shown in FIGS. 8 and 9, so that the contact pins 24 can come into contact with and electrically connect to bottom portions of the semispherical terminals 100b of the IC package 100 accommodated on the accommodating part 20b.

In the recess 20c of the socket main body 20, a contact pin holder 25 is embedded for accommodating the contact pins 24, as shown in FIG. 6. The contact pin holder 25 has a honeycomb structure with lattice end faces and is formed in such a way that the internal spaces of honeycomb cells which are mutually adjacent in one direction of the lattice arrangement at the end face are in communication with each other. As shown in FIGS. 8 and 9, the opposite ends of the contact pins 24 are inserted through upper insertion holes 25a and lower insertion holes 25b collectively forming the lattice end faces of the contact pin holder 25. Each of the contact pins 24 has an upper contact part 24a, a lower contact part 24b and a spring part 24c. The upper contact part 24a passes through the corresponding upper insertion hole 25a and the corresponding through hole 22b to come into contact with the corresponding semispherical terminal 100b of the IC package 100. The lower contact part 24b passes through the corresponding lower insertion hole 25b to come into contact with an electrode part of the wiring board (not shown). The spring part 24c is formed in a curved shape bridging the contact parts 24a and 24b.

Figure 3:
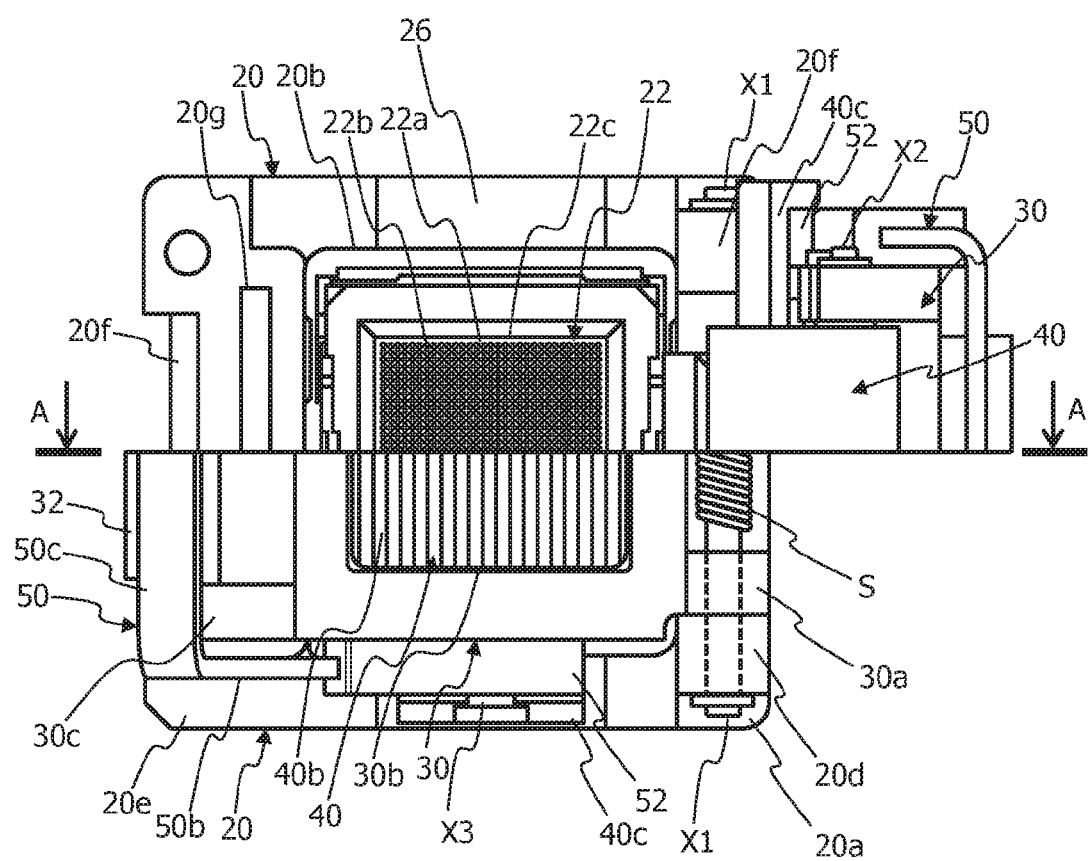
FIG. 3 is a plan view of the IC socket, the lower part of which shows the state in FIG. 1, and the upper part of which shows the state in FIG. 2.

In FIG. 3, guide members 26 are provided along sides of the accommodating part 20b, which are perpendicular to the first rotation shaft X1, at the upper surface 22a of the floating plate 22. In other words, the guide members 26 are provided in the vicinity of opposite sides 22c of the floating plate 22, which are parallel to the central axis perpendicular to the first rotation shaft X1. Each guide member 26 is urged to move up by an unillustrated spring. When the socket cover 30 is closed, the guide members 26 abut, from below, to the heat dissipating member 40, which will be described later, and guide the heat dissipating member 40 downward while keeping the abutting surfaces of the heat dissipating member 40 and the IC package 100 parallel to each other.

Two first bearing portions 20d are protrudingly provided on the upper surface of the one-side end portion 20a of the socket main body 20 as shown in FIGS. 1 to 6. The first rotation shaft X1 is inserted through these first bearing portions 20d.

Figure 7:
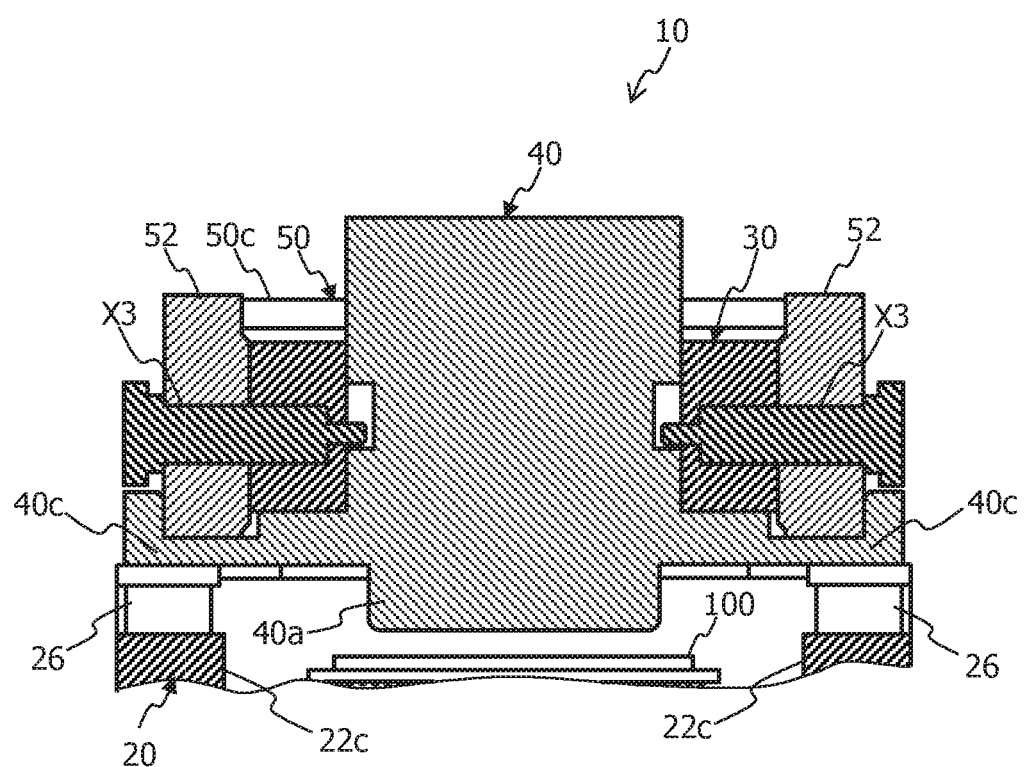
FIG. 7 is a cross-sectional view taken along line B-B of FIG. 5.

The socket cover 30 is mounted on the socket main body 20 from above. This socket cover 30 rotates around the first rotation shaft X1 that pivotally supports a one-side end portion 30a of the socket cover 30 so that the socket cover 30 can open or close the accommodating part 20b of the socket main body 20. As shown in FIGS. 6 and 7, the socket cover 30 has an approximately rectangular opening 30b which is formed to pass through the center portion of the socket cover 30 in the vertical direction in the closed state. In addition, the socket cover 30 also has a latch member 32 which will be described later on the other-side end portion 30c thereof.

The latch member 32 holds the socket cover 30 in the closed state by locking a tip end 32a thereof to a locking claw 20f provided on the other-side end portion 20e of the socket main body 20. A base end 32b of the latch member 32 is pivotally supported by a second rotation shaft X2 provided in parallel to the first rotation shaft X1 in the other-side end portion 30c of the socket cover 30. The latch member 32 is urged to move toward the locking piece 20f by an illustrated torsion spring. The second rotation shaft X2 is inserted through second bearing portions 30d provided in the other-side end portion 30c of the socket cover 30. Note that the term "parallel" in this embodiment means a condition in which two objects extend in directions that do not intersect with each other. However, this term may alternatively be defined as a condition in which the extensions of two objects do not cross in perpendicular directions.

Figure 4:
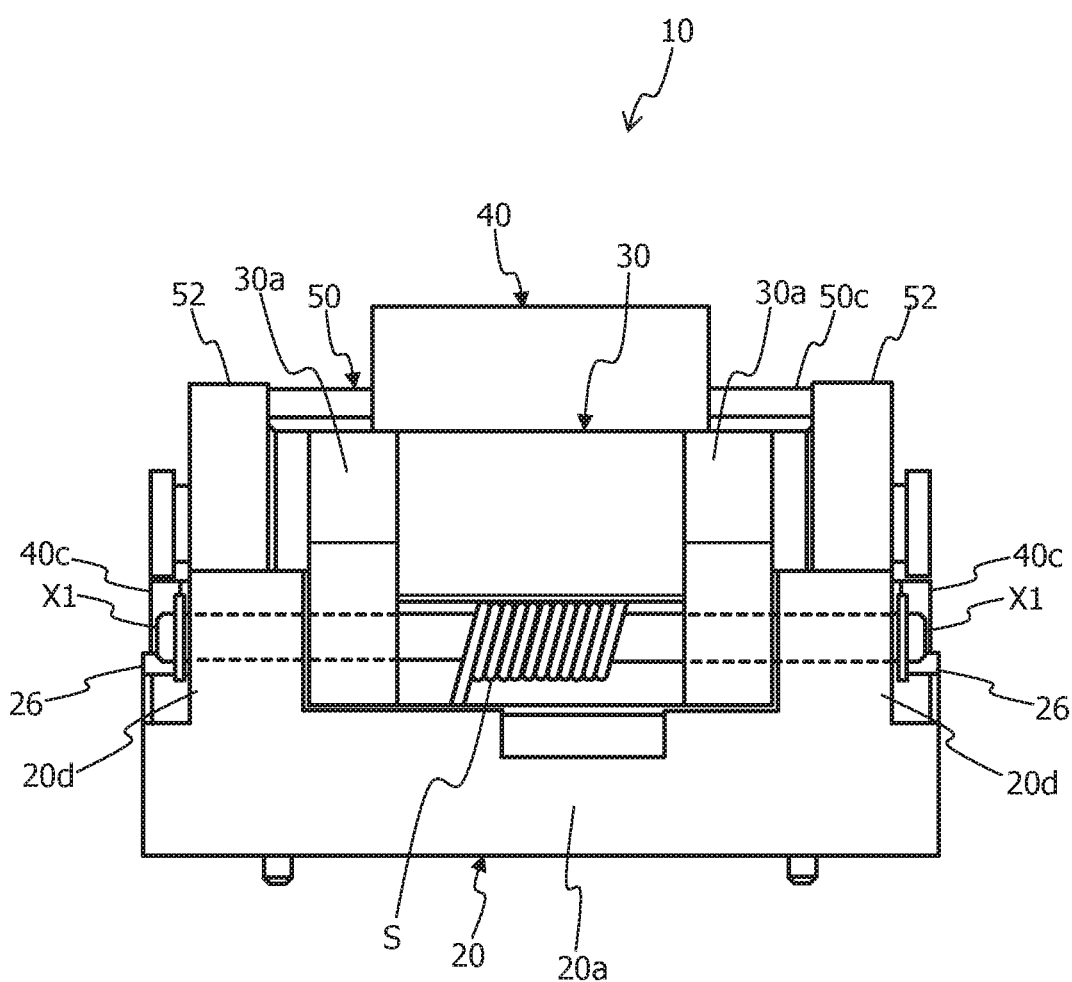
FIG. 4 is a right side view of the IC socket.
Figure 5:
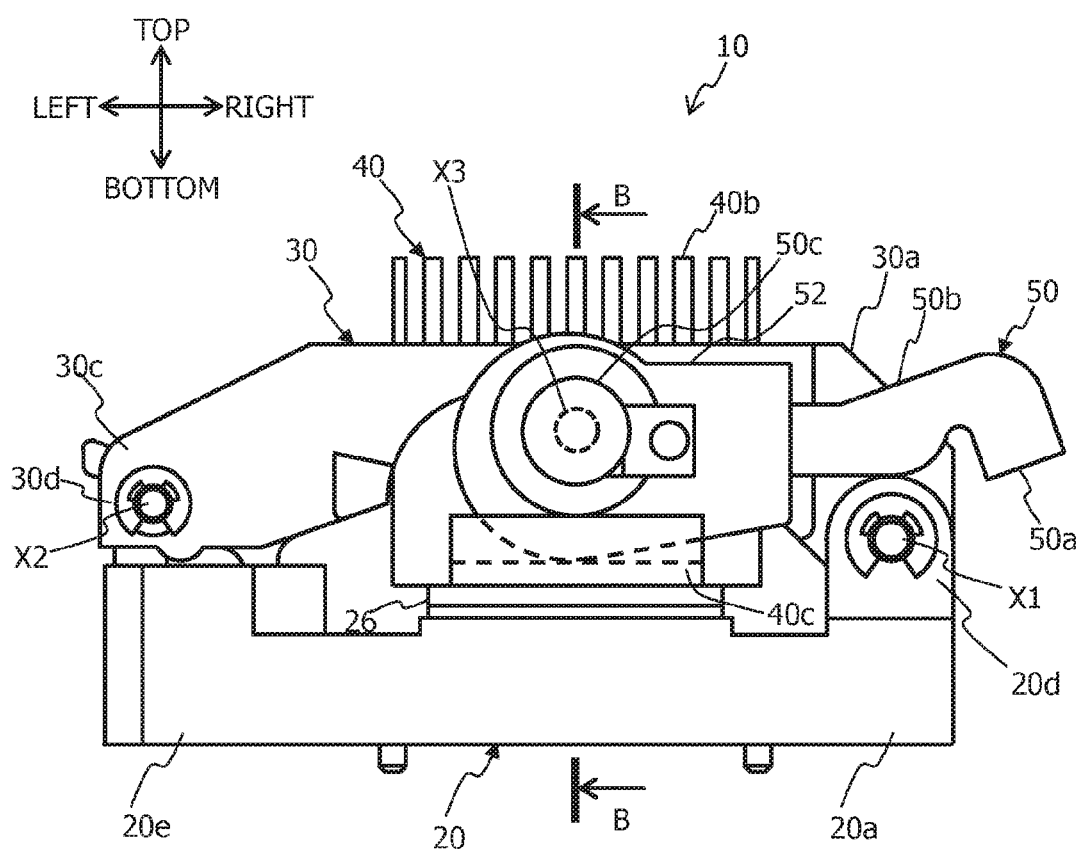
FIG. 5 is a front view of the IC socket in which the socket cover is closed and the lever member is locked.

As shown in FIGS. 3 and 4, a spring S is wound around the first rotation shaft X1. The spring S abuts, at one end, to the lower surface of the socket cover 30 when it is in the closed state, and abuts, at the other end, to the upper surface of the socket main body 20 so as to constantly apply an urging force to the socket cover 30 in the opening direction.

In the middle portion of the socket cover 30, third bearing portions 30e, through which a third rotation shaft X3 is inserted in parallel to the first rotation shaft X1, are provided so as to protrude downward in the closed state. The third rotation shaft X3 extends between the inside of the opening 30b of the socket cover 30 and the outside of the socket cover 30. The heat dissipating member 40, provided in the opening 30b of the socket cover 30, is pivotally supported by the third rotation shaft X3 so as to rotate in the opening 30b of the socket cover 30. The heat dissipating member 40 is pushed down in the opening 30b of the socket cover 30 to abut on the upper surface of the IC package 100 accommodated on the accommodating part 20b when the socket cover 30 is in the closed state. For example, as shown in FIG. 7, if the third rotation shaft X3 has two members extending inside the opening 30b from front and back faces of the IC socket 10 in the closed state, groove-shaped elongate holes each for fitting to the corresponding one of the two members of the third rotation shaft X3 are formed in the heat dissipating member 40. The groove-shaped elongate holes extend in the vertical direction so that the third rotation shaft X3 can follow the movement of the heat dissipating member 40 while pushed down.

This heat dissipating member 40, which abuts on the upper surface of the IC package 100 to dissipate heat therefrom, includes a pressing part 40a and multiple heat dissipating fins 40b. The pressing part 40a, which presses the upper surface of the IC package 100 accommodated on the accommodating part 20b when the socket cover 30 is closed, is provided to protrude downward. The heat dissipating fins 40b, which dissipate heat generated by the IC package 100 to the outside, are provided to protrude upward. In addition, the heat dissipating member 40 has flange parts 40c which abut on upper surfaces of the guide members 26.

As shown in FIGS. 1, 3, etc., the socket cover 30 is provided with the approximately U-shaped lever member 50 which vertically moves the heat dissipating member 40 up and down. Both end portions of the approximately U-shaped lever member 50 serve as base end portions 50a pivotally supported by the portions of the third rotation shaft X3 which extend to the outside of the socket cover 30. This allows the lever member 50 to rotate in relative to the socket cover 30. In addition, the lever member 50 includes a pair of arm portions 50b extending in parallel to each other from the base end portions 50a, and a distal end portion 50c connecting the arm portions 50b.

Each base end portion 50a of the lever member 50 is provided with a cam 52 that rotates around the third rotation shaft X3. The cams 52 abut on upper surfaces of the flange parts 40c of the heat dissipating member 40 whose weight is supported by the guide members 26 in the closed state. Each cam 52 is formed so that, when the lever member 50 rotates in the direction indicated by the arrow in FIG. 1, a distance from the rotation center of the cam 52 to the upper surface of the corresponding flange part 40c can gradually increase as the rotation angle of the lever member 50 increases; in other words, the cam 52 can gradually push down the upper surface of the corresponding flange part 40c against the upward urging force of the corresponding guide member 26. Moreover, the cam 52 is formed so as to press the upper surface of the IC package 100 via the heat dissipating member 40 while the lever member 50 is locked from rotating (in the state shown in FIG. 5). Examples of the cams 52 include circular disks provided on the base end portions 50a of the lever member 50 so that the center of the circular disk can be located off the axis center of the third rotation shaft X3.

Note that the heat dissipating member 40 and the lever member 50 collectively serve as pressing means provided to the socket cover 30 for pressing the IC package 100 accommodated on the accommodating part 20b in the closed state.

FIGS. 10 to 15 show an example of a metal plate and the socket cover 30 including the metal plate in the IC socket 10 according to this embodiment. Note that each dotted line in FIGS. 10 and 11 indicates the metal plate.

The socket cover 30 is formed to be elastically deformed in a manner to be described later by a reaction force created by the heat dissipating member 40 pressing the IC package 100 and then transmitted through the heat dissipating member 40.

Specifically, the socket cover 30 is formed by inserting an approximately rectangular frame-shaped metal plate 36 into an approximately rectangular frame-shaped resin member 34 formed of a synthetic resin by insert molding so as to extend from the one-side end portion 30a to the other-side end portion 30c. Here, the metal plate 36 is provided so that the thickness direction thereof is parallel to the direction (the vertical direction in FIG. 1) in which the socket cover 30 faces the accommodating part 20b in the closed state. In the socket cover 30, there are formed first shaft holes 30f into which the first rotation shaft X1 is inserted, second shaft holes 30g into which the second rotation shaft X2 is inserted, and third shaft holes 30h into which the third rotation shaft X3 is inserted.

To the socket cover 30, a reaction force created by a pressing force that the lever member 50 rotates to apply onto the guide members 26 is transmitted upward from the cams 52 of the lever member 50 through the third rotation shaft X3. Additionally, a reaction force that is created by a pressing force applied onto the IC package 100 force and that is then applied onto the heat dissipating member 40 may also be transmitted to the socket cover 30 in the above manner.

The rectangular frame-shaped metal plate 36, which is formed by press-molding a plate member made of a stainless steel, has a depression 36a formed in the vicinity of an area that receives a force from the third rotation shaft X3. Specifically, the depression 36a is formed by bending the metal plate 36 along lines parallel to the first rotation shaft X1. This makes the vicinity of the area receiving the upward force from the third rotation shaft X3 less stiff than the other areas in the metal plate 36, thus making the socket cover 30 to be elastically easily deformed as the heat dissipating member 40 presses the IC package 100.

The depression 36a formed by bending the metal plate 36 has a trapezoid shape in a cross section taken along the direction perpendicular to the third rotation shaft X3, that is, in a lateral cross section. Specifically, the depression 36a is formed so that its opening area can gradually increase from the bottom to the opening. Alternatively, the depression 36a may be formed to have a lateral cross section with any one of various shapes such, for example, as a circular arc shape, a U shape, a semicircle shape and a V shape. Moreover, the lateral cross section of the depression 36a does not have to be a single non-repeated shape, but may be formed by repeating a shape or by combining various shapes.

Figure 11:
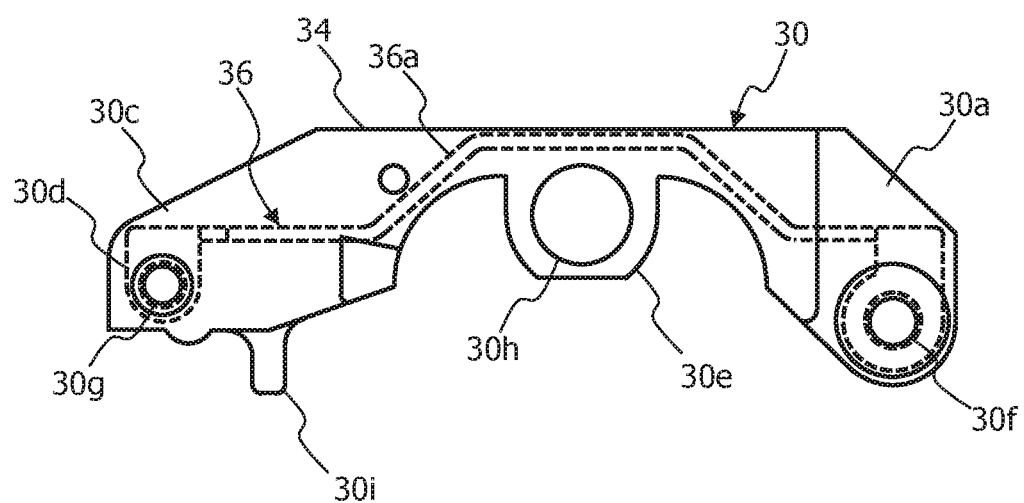
FIG. 11 is a front view of the socket cover of the IC socket.
Figure 12:
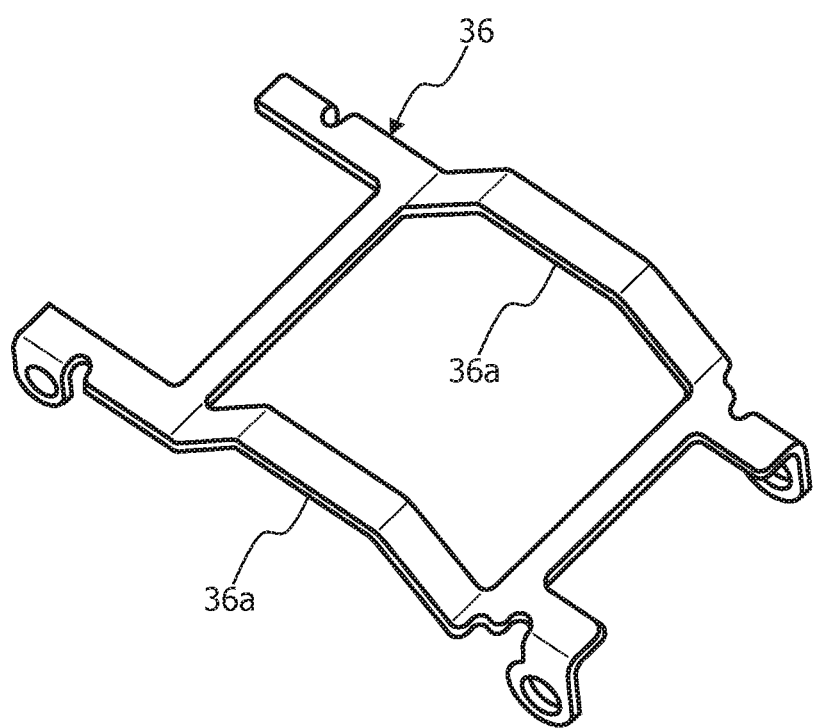
FIG. 12 is a plan view of a metal plate of the socket cover of the IC socket.
Figure 13:
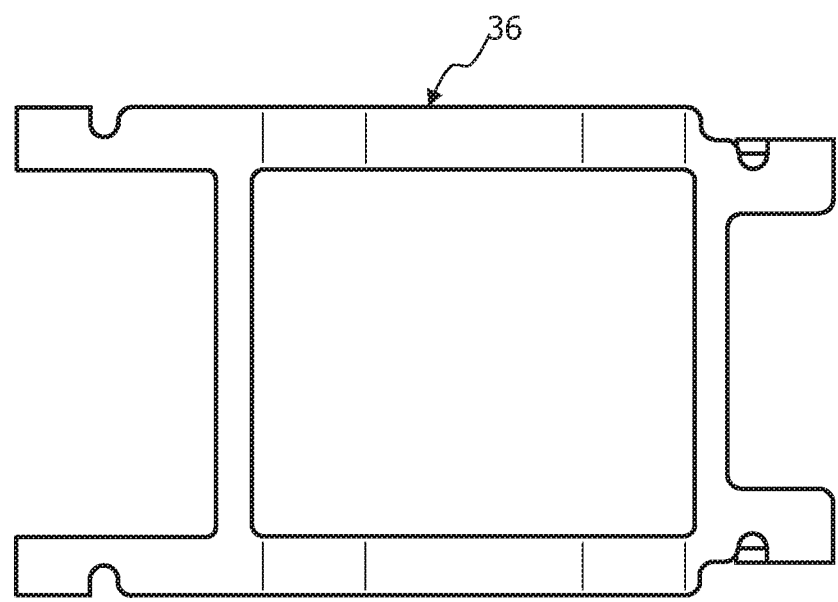
FIG. 13 is a front view of the metal plate of the socket cover of the IC socket.
Figure 14:
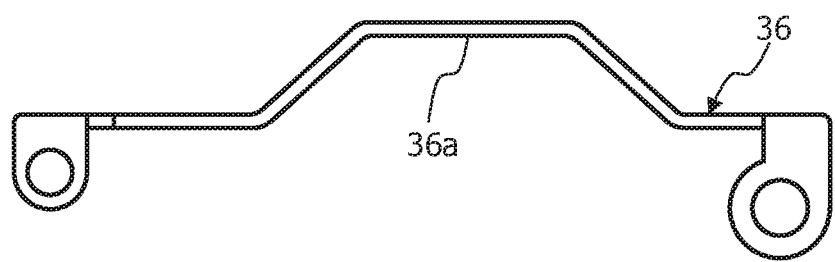
FIG. 14 is a right side view of the metal plate of the socket cover of the IC socket.
Figure 15:
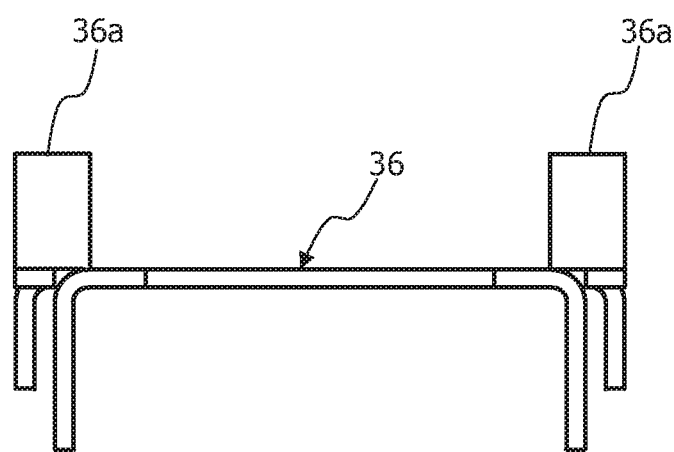
FIG. 15 is a perspective view of the socket cover of the IC socket as viewed from diagonally above.
Figure 16:
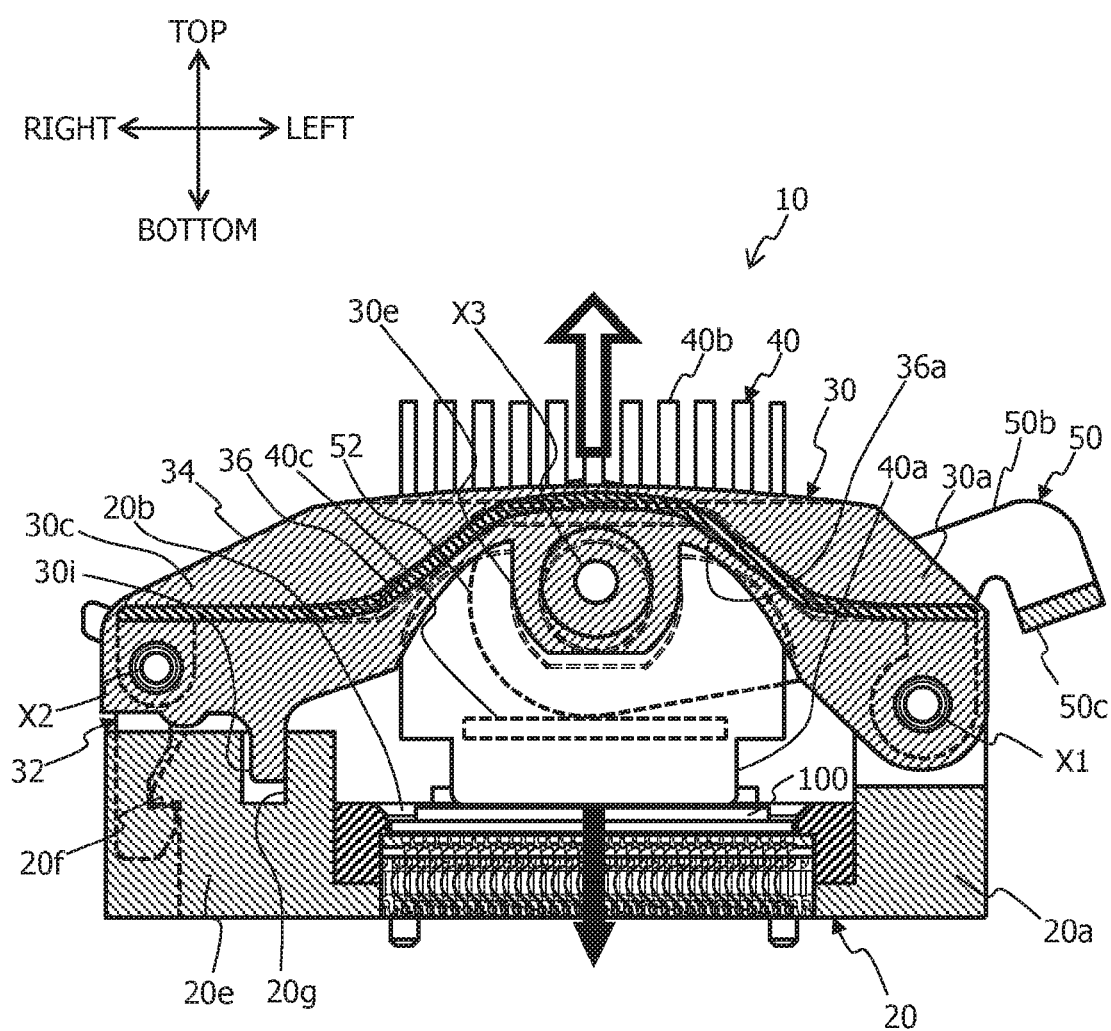
FIG. 16 illustrates how a pressing power is applied onto the IC package when the socket cover includes the metal plate.

In the socket cover 30, a protrusion 30i is formed in an area located between the other-side end portion 30c and the depression 36a and close to the other-side end portion 30c, as shown in FIG. 11. Meanwhile, in the socket main body 20, a recess 20g for fitting to the protrusion 30i in the closed state is formed in an area facing, in the closed state, the aforementioned area of the socket cover 30, as shown in FIG. 6. Fitting the protrusion 30i of the socket cover 30 into the recess 20g of the socket main body 20 in the closed state as described above makes the other-side end portion 30c of the socket cover 30 less likely to be displaced toward the third rotation shaft X3 even while the socket cover 30 is deformed upon receiving the upward force from the third rotation shaft X3. This reduces the risk of allowing the latch member 32 of the socket cover 30 that has been locked to the locking claw 20f of the socket main body 20 to accidentally come off from the locking claw 20f, thus reducing the risk of making the latch member 32 unable to hold the socket cover 30 in the closed state any longer.

The protrusion 30i and the recess 20g may be formed to extend in parallel to the third rotation shaft X3 so that the protrusion 30i can remain stably fitted in the recess 20g even after the socket cover 30 receives the upward force from the third rotation shaft X3. Note that the protrusion 30i and the recess 20g may alternatively be formed respectively in the socket main body 20 and the socket cover 30, though apparent.

Next, description will be given of the operation of the IC socket 10 configured as above.

Figure 2:
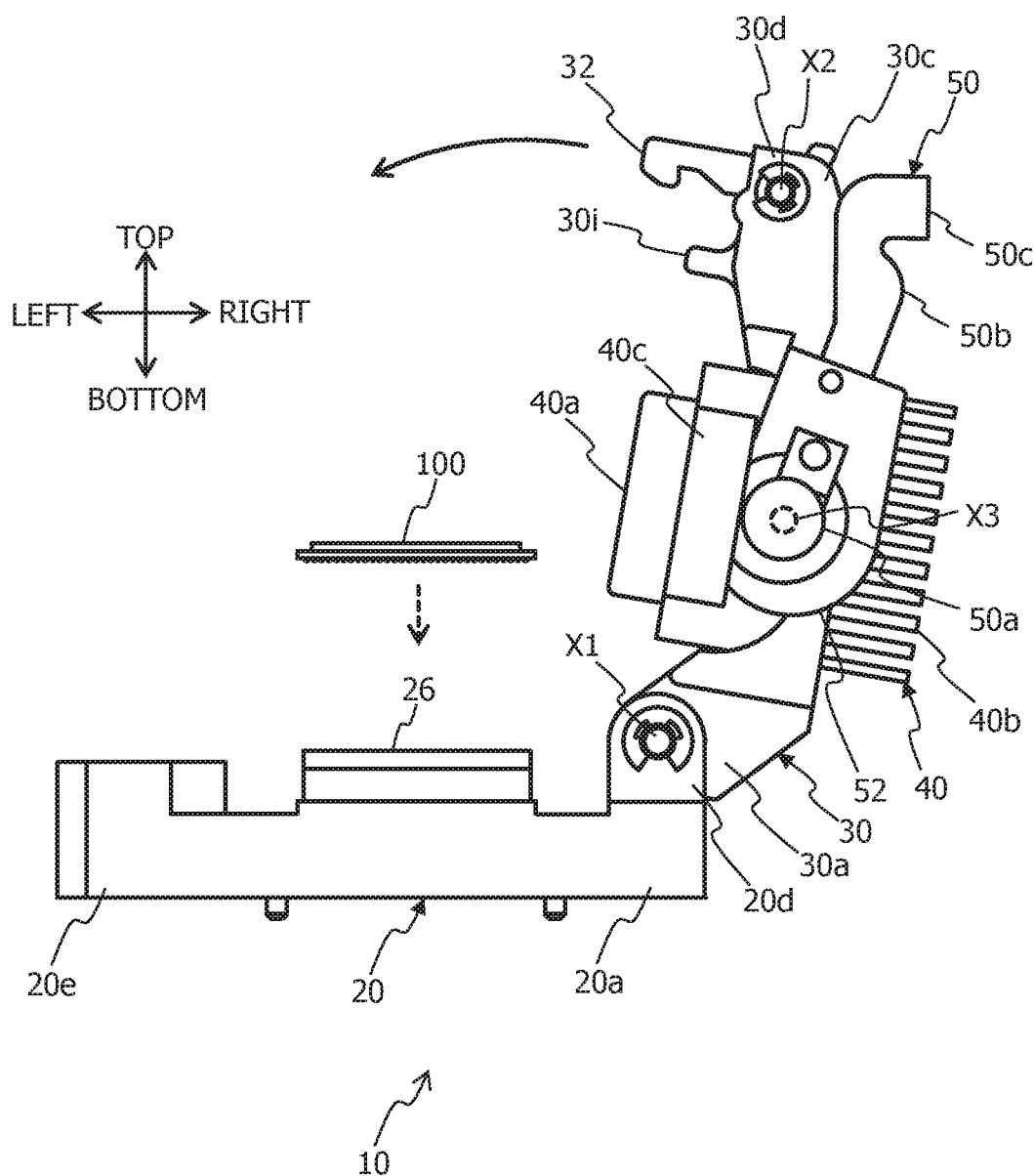
FIG. 2 is a front view of the IC socket in which the socket cover is opened.

Firstly, as shown in FIG. 2, the IC package 100 is accommodated on the upper surface 22a, which serves as the accommodating part 20b, of the floating plate 22 while the socket cover 30 of the IC socket 10 is opened (accommodated in the direction indicated by the dotted arrow in FIG. 2)

Then, the socket cover 30 is closed (in the direction indicated by the solid arrow in FIG. 2) to be in the state shown in FIG. 1, and held in the closed state by locking the latch member 32 of the socket cover 30 to the locking claw 20f of the socket main body 20, as shown in FIG. 6. In the closed state, the protrusion 30i of the socket cover 30 is fitted in the recess 20g of the socket main body 20.

Thereafter, the lever member 50 is rotated in the direction indicated by the arrow in FIG. 1. Thereby, the cams 52 gradually push down the heat dissipating member 40 in accordance with the increase in the rotation angle of the lever member 50. As a result, the cams 52 firstly press the guide members 26 to move the heat dissipating member 40 down while keeping the mutual abutting surfaces of the heat dissipating member 40 and the IC package 100 parallel to each other. Then, after the lower surface of the pressing part 40a of the heat dissipating member 40 abuts on the upper surface of the IC package 100, the cams 52 press the heat dissipating member 40 to move the guide members 26 and the IC package 100 down further until the lever member 50 is locked from rotating in the state shown in FIG. 5. When pressed as described above, the IC package 100 pushed down the floating plate 22 against the urging force of the spring (not shown) as indicated by the dotted arrow in FIG. 8.

That pressing force applied onto the guide members 26 and the IC package 100 creates an upward reaction force. This upward reaction force is firstly applied onto the heat dissipating member 40, and then transmitted through the flange parts 40c of the heat dissipating member 40, the cams 52 of the lever member 50 and the third rotation shaft X3 in this order, and finally acts to the socket cover 30.

Here, the socket cover 30 has a reduced stiffness in the vicinity of the third rotation shaft X3 where the depression 36a is formed by bending the metal plate 36. Accordingly, when the upward force from the third rotation shaft X3 acts to the socket cover 30, the socket cover 30 is elastically deformed to be warped in a slightly upward convex shape (as indicated by the blank arrow in FIG. 16) in relative to its pre-deformed outer shape indicated by the double dotted line in FIG. 16. In other words, the socket cover 30 is elastically deformed as if it were a both-end supported beam fixedly supported by the first rotation shaft X1 and the latch member 32 locked to the locking claw 20f. Note here that the latch member 32 locked to the locking claw 20f collectively serves as a locking part. In the above event, the protrusion 30i of the socket cover 30 fitted in the recess 20g of the socket main body 20 makes the other-side end portion 30c of the socket cover 30 less likely to be displaced toward the third rotation shaft X3.

This elastic deformability allows the socket cover 30 to exert a damper function to suppress the pressing force (indicated by the thick black arrow in FIG. 16) applied onto the IC package 100 even if a distance between the socket cover 30 and the IC package 100 is reduced due to accumulated molding errors of various components of the IC socket 10. In addition, the protrusion 30i fitted in the recess 20g reduces the risk of allowing the latch member 32 of the socket cover 30 that has been locked to the locking claw 20f of the socket main body 20 to accidentally come off from the locking claw 20f while the socket cover 30 is elastically deformed.

Under the conditions as described above, the spring parts 24c of the contact pins 24 are elastically deformed as shown in FIG. 9. Thereby, the upper contact parts 24a of the contact pins 24 come into contact with the semispherical terminals 100b of the IC package 100 at a predetermined contact pressure, while the lower contact parts 24b come into contact with the electrode parts (not shown) of the wiring board at the predetermined contact pressure. In addition, the lower surface of the pressing part 40a of the heat dissipating member 40 abuts on the upper surface of the IC package 100 to dissipate heat therefrom through the heat dissipating fins 40b. Under these conditions, a voltage is applied to the IC package 100 to conduct performance testing such as burn-in testing.

The IC socket 10 as described above, in which the socket cover 30 is deliberately formed to be elastically deformable enough to exert a damper function, does not require providing, between the socket cover 30 and the heat dissipating member 40, any additional damper having one or more components such as a spring. This makes the IC socket 10 capable of exerting a damper function with a simple structure, which can be manufactured with a reduced number of components and thus at reduced cost.

In addition, in the socket cover 30 of the IC socket 10 according to this embodiment, the depression 36a is formed by bending the metal plate 36 in the vicinity of the area that receives a force from the heat dissipating member 40. Thereby, the socket cover 30 is intentionally made less stiff and thus elastically deformable more greatly by a certain load than a socket cover formed by simply insert molding a metal plate. This structure is particularly effective when the IC socket 10 is miniaturized. Specifically, miniaturizing the IC socket 10 makes the socket cover 30 less deformable if a reaction force from the IC package 100 does not change. This is because, in the socket cover 30 which is like a both-end supported beam whose ends are fixedly supported by the first rotation shaft X1 and the locking part, that is, the latch member 32 locked to the locking claw 20f, a distance between these fixed ends is reduced by miniaturization. However, the socket cover 30 of the IC socket 10 includes the metal plate 36 that is bent to have a reduced stiffness, and thus is easily warped. Accordingly, even if miniaturized, the IC socket 10 remains capable of suppressing the pressing force applied onto the IC package 100.

Moreover, even when the socket cover 30 is formed to be easily warped as described above, the protrusion 30i of the socket cover 30 fitted in the recess 20g of the socket main body 20 in the vicinity of the locking part, that is, the latch member 32 of the socket cover 30 locked to the locking claw 20f of the socket main body 20, makes the other-side end portion 30c of the socket cover 30 less likely to be displaced toward the third rotation shaft X3, thus reducing the risk of allowing the latch member 32 to accidentally come off from the locking claw 20f.

Note that, though the metal plate 36 is insert-molded in the socket cover 30 in the above description of the embodiment, the structure of the socket cover 30 is not limited thereto. The socket cover 30 may be formed only of a metal material or a resin material as long as being capable of exerting a damper function by being elastically deformed upon receiving a force from the heat dissipating member 40.

Note also that, although the heat dissipating member 40 is configured to press the IC package 100 in the above, the pressing means is not limited thereto. Instead, a certain structure for pressing the IC package 100 may be interposed between the heat dissipating member 40 and the IC package 100. Alternatively, in addition to the heat dissipating member 40, there may be provided a structure for pressing the IC package 100 simultaneously as the heat dissipating member 40 presses the IC package 100.

In the above embodiment, the upper, lower, left and right sides of the IC socket 10 are determined for convenience of explanation. However, the posture of the IC socket 10 is not limited to the above.

REFERENCE SYMBOL LIST

10 IC socket
20 Socket main body
20a One-side end portion
20b Accommodating part
20d First bearing portion
20e Other-side end portion
20f Locking claw
20g Recess
30 Socket cover
30a One-side end portion
30b Opening
30c Other-side end portion
30d Second bearing portion
30e Third bearing portion
30i Protrusion
32 Latch member
32a Tip end
32b Base end
34 Resin member
36 Metal plate
36a Depression
40 Heat dissipating member
40a Pressing part
40c Flange part
50 Lever member
52 Cam
100 IC package
X1 First rotation shaft
X2 Second rotation shaft
X3 Third rotation shaft

The invention claimed is:

1. An electronic component socket, comprising:
a socket main body having an accommodating part for detachably accommodating an electronic component;
a socket cover having a one-side end portion pivotally supported by the socket main body to open or close the accommodating part, and an other-side end portion which is located opposite to the one-side end portion and lockable to the socket main body, the socket cover being held in a closed state by locking the other-side end portion to the socket main body; and
a heat dissipating member mounted on the socket cover to press the electronic component accommodated on the accommodating part in the closed state, wherein
the socket cover internally includes a metal plate extending from the one-side end portion to the other-side end portion so that a thickness direction of the metal plate is parallel to a direction in which the socket cover faces the accommodating part in the closed state, and
the metal plate has a depression formed by bending along a line parallel to a rotation axis of a rotation shaft of the socket cover in a vicinity of an area that receives a reaction force created by a pressing force that the heat dissipating member applies to the electronic component,
wherein the socket cover is further provided with any one of a protrusion and a recess between the depression and the other-side end portion, and
the socket main body is further provided with the other one of the protrusion and the recess so as to be fitted, in the closed state, to the one of the protrusion and the recess that is formed in the socket cover.

2. The electronic component socket according to claim 1, wherein the depression has a trapezoidal lateral cross section and gradually expands in an opening direction thereof.

3. The electronic component socket according to claim 1, wherein the depression opens in a direction parallel to a direction of the reaction force created by the pressing force that the heat dissipating member applies on the electronic component.

4. The electronic component socket according to claim 1, wherein a plurality of the depressions are formed.

5. The electronic component socket according to claim 1, wherein
the socket cover has a locking part pivotally supported at a base end to the other-side end portion and formed at a tip end to be lockable to the socket main body for holding the socket cover in the closed state by locking to the socket main body, and
the locking part rotates around a rotation shaft provided in parallel to the rotation shaft of the socket cover.

6. The electronic component socket according to claim 1, wherein the protrusion and the recess extend in parallel to the rotation axis of the rotation shaft of the socket cover.

7. The electronic component socket according to claim 1, wherein the one of the protrusion and the recess that is formed in the socket cover is located close to the other-side end portion.

8. An electronic socket comprising:
a socket main body having an accommodating part for detachably accommodating an electronic component;
a socket cover having a one-side end portion pivotally supported by the socket main body to open or close the accommodating part, and an other-side end portion which is located opposite to the one-side end portion and lockable to the socket main body, the socket cover being held in a closed state by locking the other-side end portion to the socket main body; and
a heat dissipating member mounted on the socket cover to press the electronic component accommodated on the accommodating part in the closed state,
wherein
the socket cover internally includes a metal plate extending from the one-side end portion to the other-side end portion so that a thickness direction of the metal plate is parallel to a direction in which the socket cover faces the accommodating part in the closed state, the metal plate has a depression formed by bending along a line parallel to an axis of a rotation shaft of the socket cover in a vicinity of an area that receives a reaction force created by a pressing force that the heat dissipating member applies to the electronic component, in the closed state, a cam pivotally supported by the socket cover rotates to cause the heat dissipating member to gradually press the electronic component, a rotation shaft of the cam is provided in parallel to the rotation shaft of the socket cover, and the depression is formed in the vicinity of the rotation shaft of the cam.

9. The electronic component socket according to claim 8, wherein each of the socket cover and the metal plate internally included therein is formed in a rectangular frame shape, and the heat dissipating member is placed in the socket cover.

\* \* \* \* \*